United States Patent [19]

Poe et al.

[11] Patent Number: 4,674,930

[45] Date of Patent: Jun. 23, 1987

[54] STAND-OFF FASTENER

[75] Inventors: L. Richard Poe, Long Beach; Raymond E. Harmon, Tustin, both of Calif.

[73] Assignee: Hartwell Corporation, Placentia, Calif.

[21] Appl. No.: 478,471

[22] Filed: Mar. 23, 1983

Related U.S. Application Data

[63] Continuation-in-part of Ser. No. 330,260, Dec. 14, 1981, Pat. No. 4,502,193.

[51] Int. Cl.⁴ ............................................. F16B 13/04
[52] U.S. Cl. .................................... 411/40; 411/508; 24/606; 24/607
[58] Field of Search ................ 411/508, 509, 510, 40, 411/41; 24/606, 607, 608, 453, 297

[56] References Cited

U.S. PATENT DOCUMENTS

| | | | |
|---|---|---|---|
| 2,767,877 | 10/1956 | Newsom | 411/44 X |
| 3,568,263 | 3/1971 | Meehan | 24/297 X |
| 3,697,104 | 10/1972 | Soulie | 24/211 R X |
| 3,764,729 | 10/1973 | Kowalewski | 174/138 D |
| 3,811,154 | 5/1974 | Lindeman | 174/138 D |
| 3,852,849 | 12/1974 | Pestka | 74/138 D |
| 3,918,130 | 11/1975 | Poe | 411/41 X |
| 4,007,516 | 2/1977 | Coules | 174/138 D X |
| 4,114,509 | 9/1978 | Poe | 24/214 X |
| 4,276,806 | 7/1981 | Morel | 411/41 |

FOREIGN PATENT DOCUMENTS 1122512 8/1968 United Kingdom ................ 411/41

Primary Examiner—Gary L. Smith
Assistant Examiner—Adrian H. Whitcomb, Jr.
Attorney, Agent, or Firm—Lyon & Lyon

[57] ABSTRACT

A fastener for securing two objects or structures together in a predetermined relationship. The fastener has a fastener body including a spacer which defines a predetermined distance between the two objects. A first locking element is attached to one side of the spacer and a second locking element is attached to the other side of the spacer. The fastener body is adapted to receive a plunger which when actuated will cause the locking elements to secure the first object and second object a predetermined distance apart.

15 Claims, 36 Drawing Figures

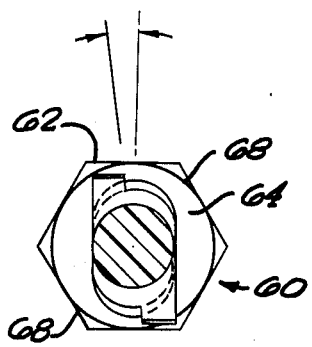
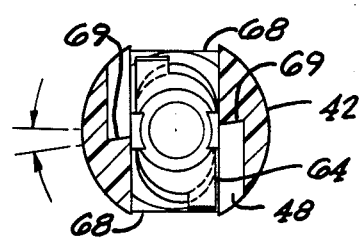
FIG. 6.                    FIG. 7.
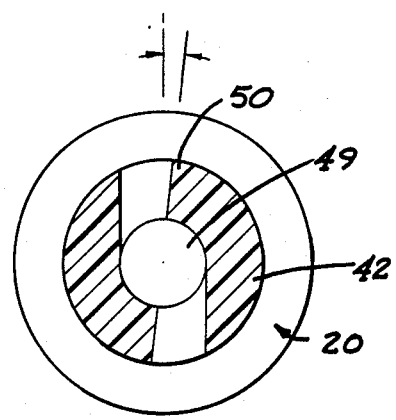
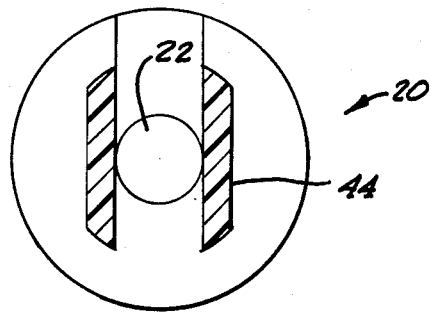
FIG. 8.                    FIG. 9.
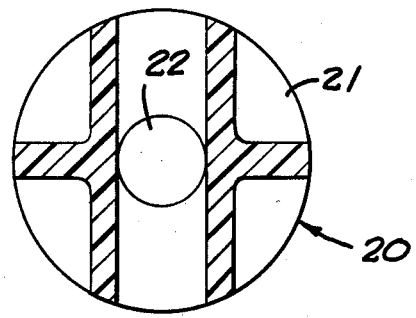
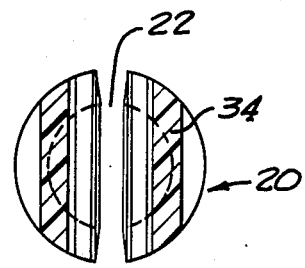
FIG. 10.                   FIG. 11.

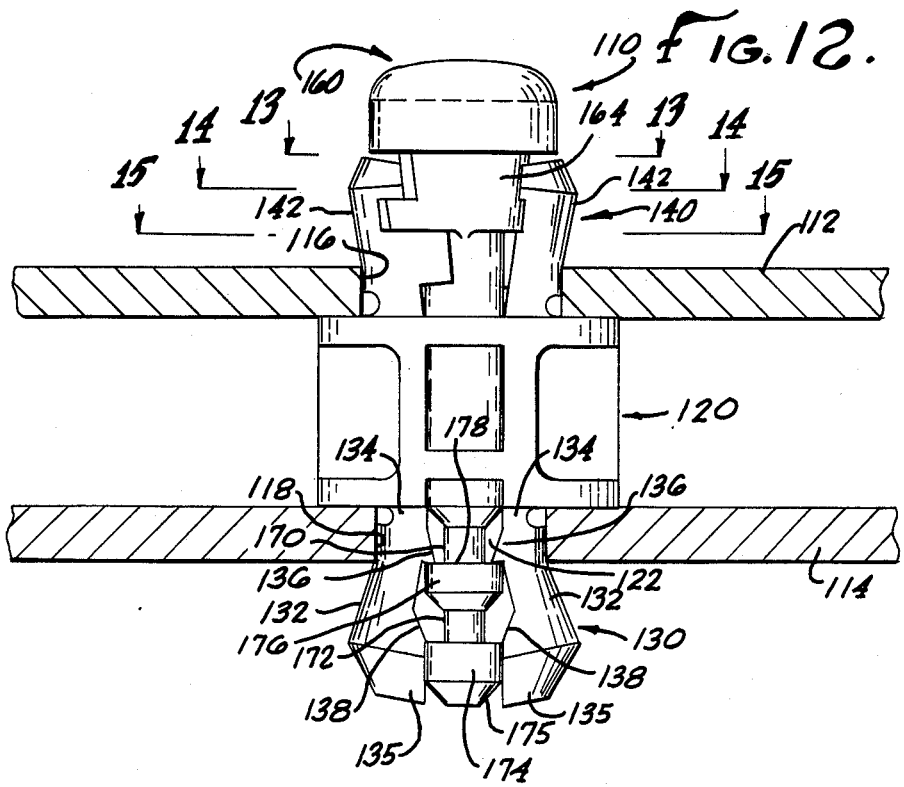
FIG. 12.
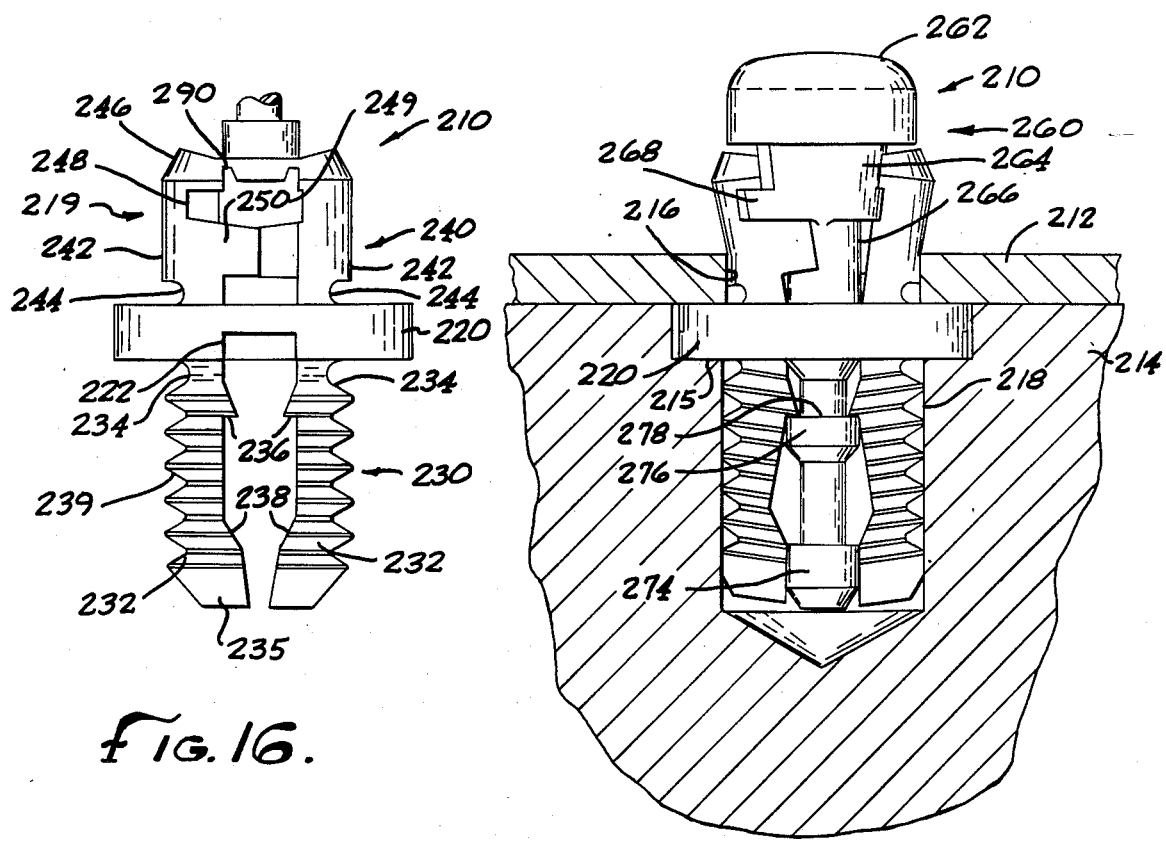
FIG. 16.
FIG. 17.

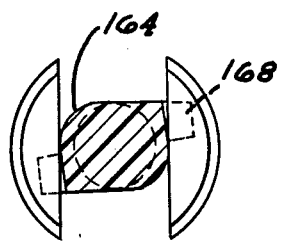
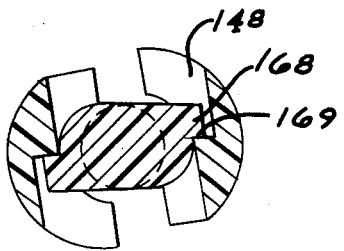
fig. 13.  fig. 14.
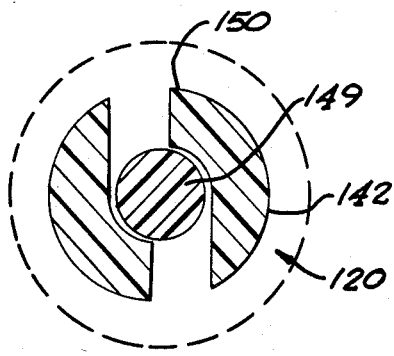
fig. 15.

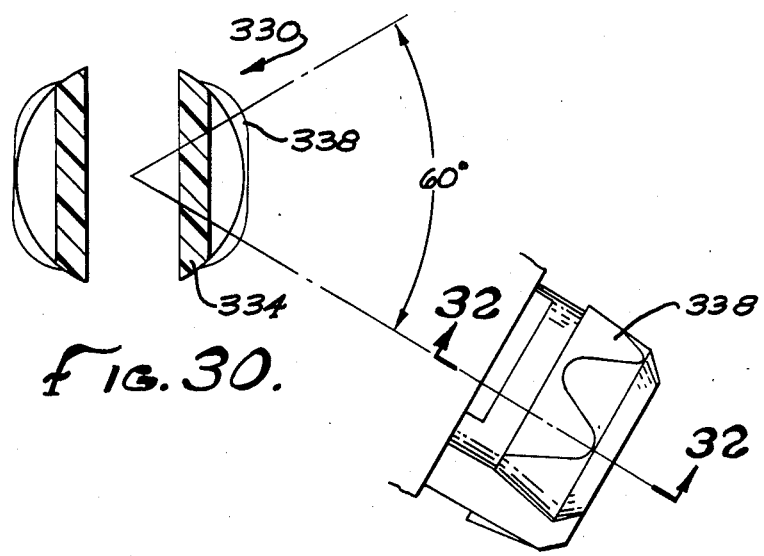
FIG. 30.
FIG. 31.
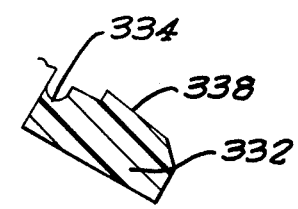
FIG. 32.
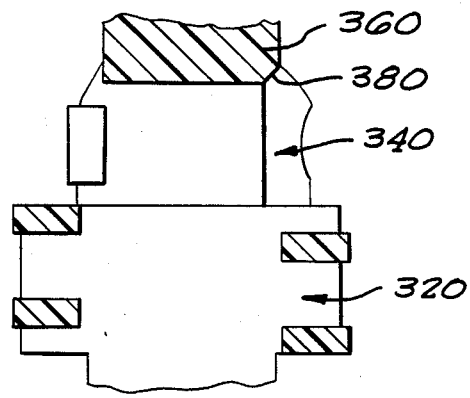
FIG. 33.

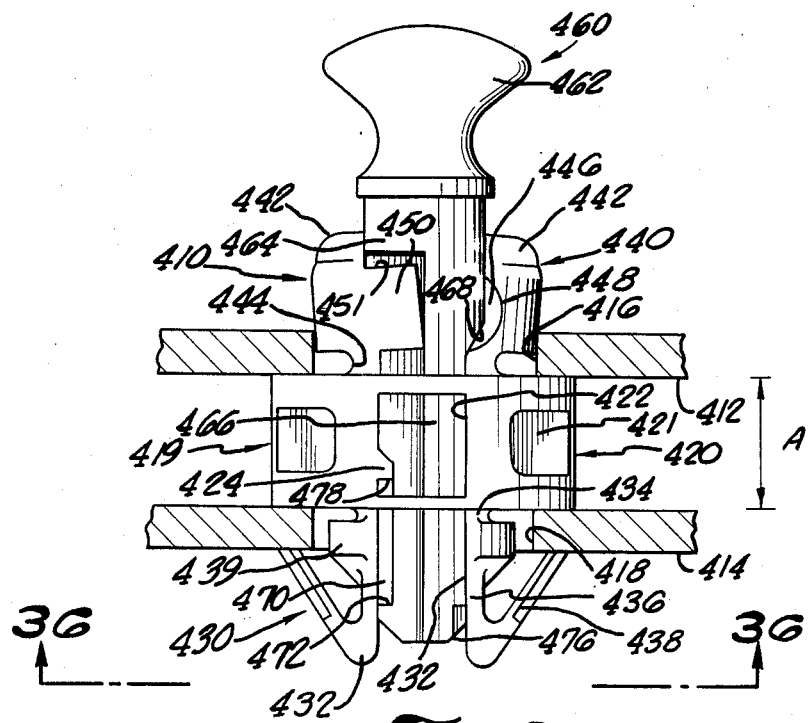
FIG. 34.
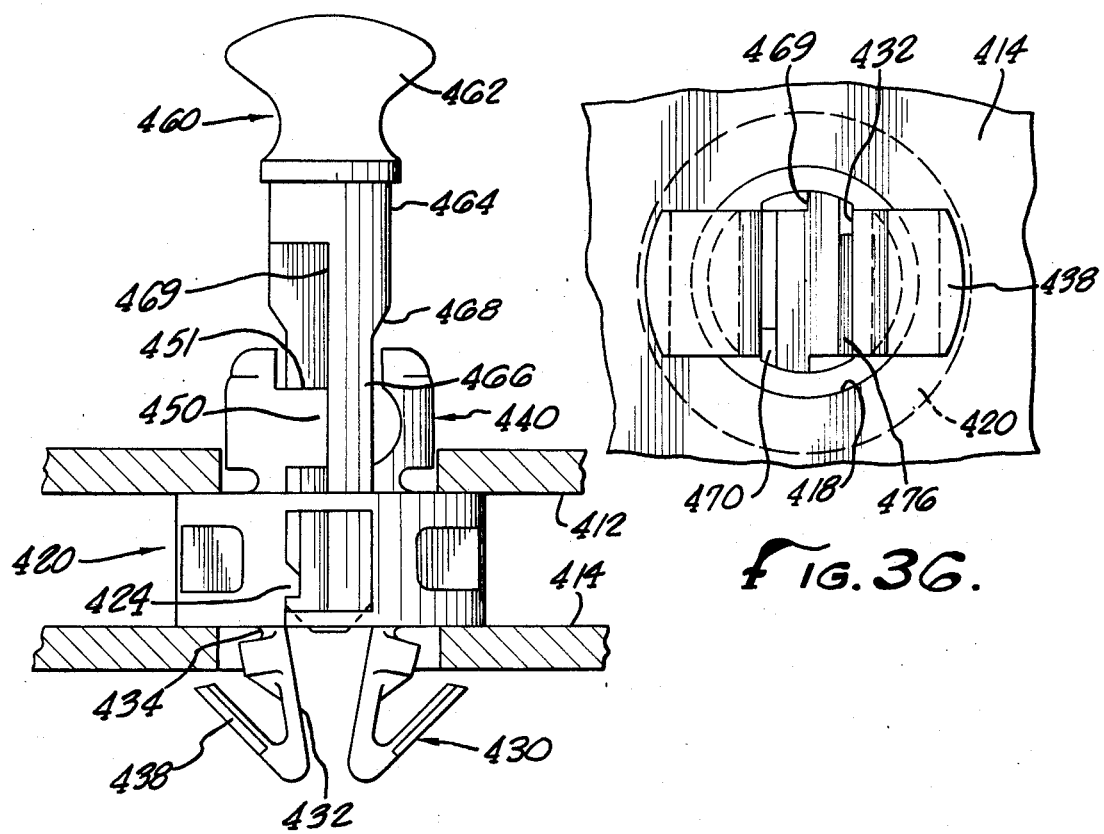
FIG. 35.
FIG. 36.

4,674,930

STAND-OFF FASTENER

CROSS-REFERENCE TO RELATED APPLICATION

This is a continuation-in-part of application Ser. No. 330,260, filed Dec. 14, 1981, now U.S. Pat. No. 4,502,193.

BACKGROUND OF THE INVENTION

This application is directed toward fasteners and in particular those that are useful for selectively locking two objects to each other in a predetermined relationship.

For numerous reasons it is often useful to provide a mechanism which is able to secure or lock two objects or structures to each other in a fixed relationship and provide for a defined space between the objects. This is often desirable in electrical applications where spacing is critical in order to prevent interference between the electrical components mounted on adjacent circuit boards or between the electrical components on a circuit board and the chassis.

In the case of circuit boards, it is oftentimes necessary to mount a circuit board to a chassis. In other instances, it may be necessary to mount a series of boards in a stacked relationship. When mounting a board to a chassis the board is placed onto mounts or supports which have means for affixing the board immovably to the chassis.

Various mounts or supports in the past have been used to affix a circuit board to a chassis where a predetermined distance is intended to exist between the circuit board and the chassis. For example, a steel screw may be placed into an aperture of a circuit board with a non-conductive washer disposed between the head of the screw and the circuit board. On the other side of the circuit board from the washer a non-conductive hollow spacer is fitted over the threads of the screw. The threaded end of the screw passes through an aperture, another circuit board or a chassis and receives a second non-conductive washer and a nut. The screw and nut assembly is then tightened to secure the circuit board to the chassis or second circuit board. This screw and nut assembly is advantageous because it provides for a good mechanical fit and will not ordinarily vibrate loose. In addition, because the washers and spacer each extend a full 360° about the screw, good support is provided on both sides of the circuit board or both sides of the chassis. However, there are several disadvantages associated with this type of assembly, which requires several separate pieces and multi-step installation, including high material and stocking costs and high labor cost.

Alternatively, single-piece supports exist such as those marketed by FASTEX, a division of Illinois Tool Works, Inc. These supports have one end which snaps into an aperture of a circuit board and another end which is received by an aperture in the chassis. These supports have pronged or barbed ends or are barbed at one end and have a canoe clip at the other end. These supports are advantageous because of lower product and labor installation costs. However, they do not provide for a positive mechanical fit between the ends of the support and the circuit board or chassis and as a result they can vibrate loose of the circuit board or chassis. Furthermore, the prongs or barbs offer only limited contact between the support and the circuit board which can be insufficient when certain pressure is applied to the circuit board. Lastly, these type supports are less suitable for automated installation.

It is also known that a NYLATCH fastener may be used which has an extended length grommet. The grommet is fitted through an aperture in the circuit board and a plunger is partially actuated to connect the fastener to the circuit board by partially expanding the grommet. A plurality of washers may then be fitted over a portion of the grommet that extends beyond the underside surface of the circuit card. The grommet is then placed through an aperture in a chassis and is further expanded by the plunger to secure the grommet to the chassis and thereby fasten the circuit board and chassis together with the washers acting as a spacer to maintain the circuit board and chassis a predetermined distance apart. The use of a NYLATCH fastener is advantageous because it provides for a positive mechanical fit or lock between the fastener and the circuit board or chassis. However, the NYLATCH fastener is generally secured to the circuit board before the electrical components are added to the circuit board to prevent damage thereto during installation of the fastener because of the force required to activate the plunger. Thus, the fasteners must travel with the circuit boards during production and shipping of the circuit boards which may be undesirable because, in part, larger shipping containers are required to accommodate the extending portions of the fasteners. Furthermore, the addition of the washers slows installation and results in increased product and inventory costs.

SUMMARY OF THE INVENTION

The present invention is intended to satisfy an existing need for a fastener which overcomes the problems and disadvantages associated with the various prior art fasteners and supports discussed above. Such a fastener must be capable of securing or locking a first object or structure, such as a chassis or circuit board, to a second object or structure, such as another circuit board, and establishing and maintaining a predetermined distance between the two objects or structures. In the case of electrical applications, it is important that the fastener be easily opened to permit removal of a previously secured circuit board from the chassis or a first circuit board to which it is mounted, yet designed so that the fastener remains affixed to the chassis or the first circuit board for further use. The fastener of the present invention satisfies each of these requirements.

The fastener of the present invention has a fastener body with a captive plunger and includes a base member or spacer and locking elements. On one side of the spacer and attached thereto is a first locking element, which is adapted to engage a first structure, such as in the case of electrical applications, a chassis or a circuit board.

Attached to the other side of the spacer is a second locking element, which is adapted to engage a second structure, as for example a circuit board, and maintain the second structure in a fixed relationship with respect to the first structure.

The plunger is sized so that a portion of it will fit through both locking elements. The first locking element of the fastener is adapted to be inserted into an aperture in the first structure. The head of the plunger and the second locking element are adapted to extend through an aperture in the second structure. When the plunger is actuated, it will cause the first locking element to be fixably secured to the first structure. The plunger is adapted to also cause the second locking element to be fixably secured to the second structure. The spacer acts so that a defined distance exists between the first and second structures. Upon a reversal of the plunger action, the plunger will cause the release of the second structure from the second locking element thereby permitting removal of the second structure from the fastener. However, the plunger remains captive with respect to the fastener body and the fastener remains captive with respect to the first structure.

In the preferred embodiment of the invention, actuation of the plunger is a two step procedure. In the first step the plunger is pushed fully into the fastener body thereby expanding the first locking element to affix the fastener to the first structure. The second step involves turning the plunger through a controlled angle thereby expanding the second locking element to affix the fastener to the second structure.

In another form of the invention, actuation of the plunger is a single step procedure. When the plunger is pushed fully into the fastener body both the first and second locking elements are expanded to thereby rigidly affix the fastener to both the first and second structures.

In either form of the invention, prior to full actuation of the plunger, alignment of the first and second structures is facilitated by a free-float effect where at least one of the structures is allowed to move radially with respect to the locking element before the structure is affixed to the fastener. When the plunger has been fully actuated relative movement between the fastener and the first and second structures is substantially eliminated which thereby prevents wear or damage due to vibration.

The present invention includes several features and advantages not present in the prior art fasteners or supports. For example, the fastener of the present invention provides for a positive mechanical fit between the fastener and the object or structure to eliminate problems due to vibration. The fastener of the present invention is molded in a one-piece configuration. However, it is stored and shipped as a one-piece item consisting of two individual preassembled pieces to minimize inventory, shipping and installation. These and other features and advantages of the present invention will become more apparent from a review of the detailed description of the invention and the accompanying drawings.

DESCRIPTION OF THE DRAWINGS

FIG. 6 is a cross-section taken substantially along section line 6—6 of FIG. 5.

FIG. 7 is a cross-section taken substantially along section line 7—7 of FIG. 5.

FIG. 8 is a cross-section taken substantially along section line 8—8 of FIG. 5.

FIG. 9 is a cross-section taken substantially along section line 9—9 of FIG. 5.

FIG. 10 is a cross-section taken substantially along section line 10—10 of FIG. 5.

FIG. 11 is a cross-section taken substantially along section line 11—11 of FIG. 5.

FIG. 12 is a side view illustrating a second embodiment of the present invention in a fully locked position.

FIG. 13 is a cross-section taken substantially along section line 13—13 of FIG. 12.

FIG. 14 is a cross-section taken substantially along section line 14—14 of FIG. 12.

FIG. 15 is a cross-section taken substantially along section line 15—15 of FIG. 12.

FIG. 16 is a side view illustrating another embodiment of the present invention in an as molded configuration.

FIG. 17 is a side view illustrating the FIG. 16 embodiment of the present invention in a fully locked configuration.

FIG. 30 is a cross-section taken substantially along section line 30—30 of FIG. 20.

FIG. 31 is a side view illustrating the first locking element of the FIG. 18 embodiment of the fastener of the present invention.

FIG. 32 is a cross-section taken substantially along section line 32—32 of FIG. 31.

FIG. 33 is a cross-section taken substantially along section line 33—33 of FIG. 20.

FIG. 34 is a side view illustrating still another embodiment of the present invention in a fully locked position.

FIG. 35 is a side view illustrating the FIG. 34 embodiment of the present invention in an unlocked position.

FIG. 36 is a bottom view taken substantially along view line 36—36 of FIG. 34 illustrating the first locking element of the FIG. 34 embodiment of the present invention.

DETAILED DESCRIPTION OF THE PREFERRED EMBODIMENTS

Figure 1:
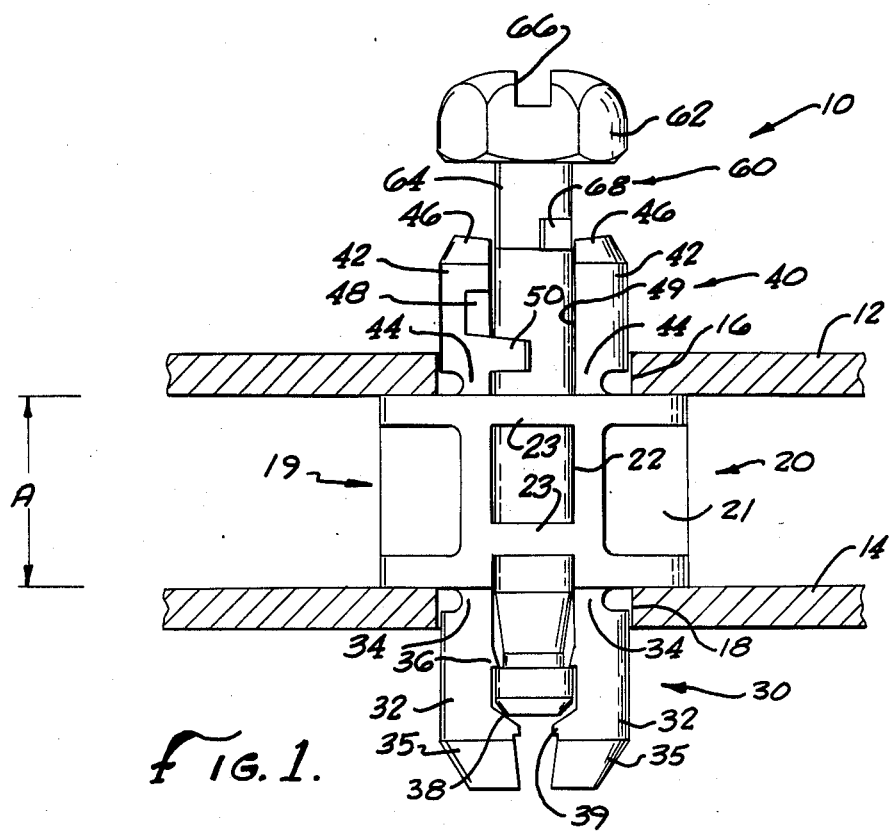
FIG. 1 is a side view illustrating a preferred embodiment of the present invention in an unlocked position.

A preferred embodiment of the present invention is shown in FIGS. 1 through 11, and comprises a fastener, generally designated as 10, which is preferably made of a non-conductive material, such as plastic. Briefly, the fastener 10, as shown in FIG. 1, is operative to affix a structure, such as a circuit board 12 to another structure, such as chassis 14, wherein a predetermined distance A is intended to exist between the board 12 and the chassis 14.

Circuit boards typically have a plurality of spaced apertures, such as aperture 16, extending entirely through the body of the circuit board 12. Similarly, a chassis, such as the type used in computers or other electronic equipment wherein circuit boards are to be mounted, also includes a plurality of spaced apertures, such as aperture 18, defined therein. The apertures 16 and apertures 18 are uniformly spaced to permit their alignment when the circuit board 12 is to be mounted to the chassis 14.

A chassis is normally constructed of metal, which may act as an electrical conductor. Circuit boards are normally made of a non-conductive material, however, a plurality of raised logic lines are present on the boards and contain conductive material which connect the various electronic components mounted on the boards. These boards normally have a plurality of leads (not shown) at one end thereof which are aligned with leads (not shown) integral within the mounts of the chassis. When the boards are properly mounted within the chassis, the leads of both are aligned and in contact for electrical connection.

As shown in FIG. 1, the fastener 10 includes a fastener body, generally designated as 19. An integral part of the fastener body 19 is a generally cylindrical base member or spacer, generally designated as 20. For molding purposes, the spacer 20 includes a plurality of voids 21 which also provide for material reduction. The spacer 20 by reason of its circular surfaces 20a and 20b provides 360° of support about the aperture of the circuit board or the chassis. Disposed substantially centrally within the fastener body 19 is a channel 22, which extends entirely through the fastener body 19. A plurality of webs 23 extend between opposite portions of the spacer 20. The webs 23 add structural integrity to the fastener 20 and guide the plunger as will be discussed hereinafter.

Figure 2:
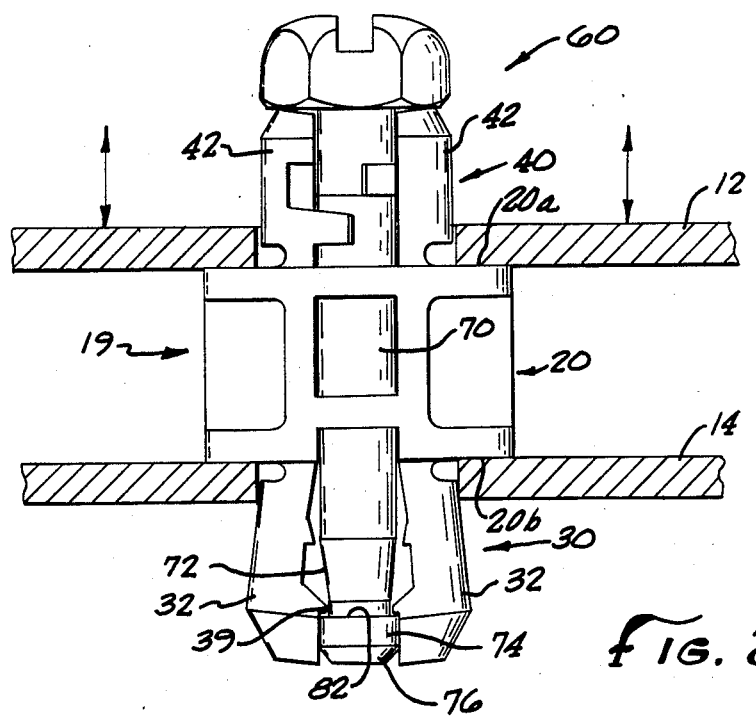
FIG. 2 is a side view illustrating the FIG. 1 embodiment of the present invention in a partially locked position.

Extending from one end of the spacer 20 and integral therewith is a first locking element, generally designated as 30, which in this preferred embodiment has two oppositely positioned captivating tabs 32, which are pivotably attached to the spacer 20 at the hinge portions 34. These captivating tabs 32 have chamfered portions 35 which facilitate placement of the first locking element 30 into and through the aperture 18. Each tab 32 is provided with an internal ridge 36 which extends into the channel 22 to captivate a plunger as will be discussed hereinafter. Each tab 32 is also provided with an angled inner cam surface 38 which causes the spreading of the tabs 32 into the locked position when the plunger is fully extended into the fastener body 19. At the lowermost portion of each angled inner surface 38 a protrusion 39 is provided to premanently captivate the plunger as shown in FIG. 2, and discussed in more detail later.

In the position shown in FIG. 1, the fastener 10 is capable of rotational movement with respect to the chassis 14. However, once the plunger has been fully extended into the fastener body 19, the tabs 32 are operative to provide a positive interface or mechanical lock to rigidly affix the fastener 10 to the chassis 14 and restrict any rotational movement of the fastener.

In this preferred embodiment, there are two captivating tabs 32. However, it should be apparent that additional captivating tabs (not shown) of various configurations could also be utilized.

Extending from the other end of the spacer 20 and integral therewith is a second locking element, generally designated as 40. The second locking element 40 has oppositely positioned tabs 42 which are pivotably secured to the spacer 20 at hinge portions 44. Each of the tabs 42 has a chamfered upper surface 46 and a recessed portion 48, as best shown in FIG. 7, on each side of the channel 22. The tabs 42 define an upper portion 49 of the channel 22 and each of the tabs 42 has an aligning piece 50 which extends partially into the upper portion 49 of the channel 22 as illustrated in FIGS. 1 and 8. The aligning pieces 50 are useful to align the plunger within the fastener body 19 and provide additional surface area to affix the circuit board 12 to the fastener 10.

A plunger, generally designated as 60, is designed to fit into the channel 22. The plunger 60 has a head portion 62 which is integral with a downwardly extending first plunger portion 64. A slot 66 is formed in the top of the head portion 62 and the head portion 62 is made hexagonal to permit rotation of the plunger 60 by the use of various tools. Below the head portion 62 and extending outwardly from the first plunger portion 64 are dual projections 68, as shown in FIGS. 1, 6, and 7. The projections 68 are adapted to fit within the recessed portions 48 of the second locking element 40 when the plunger 60 is fully extended into the fastener body 19 and is rotated to expand the second locking element 40.

Figure 3:
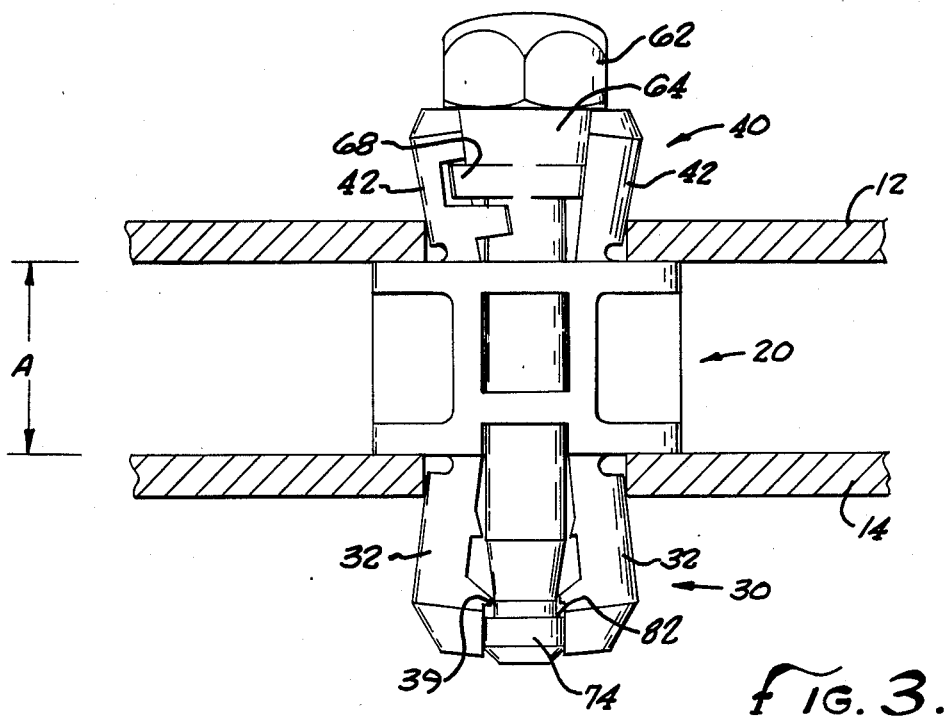
FIG. 3 is a side view illustrating the FIG. 1 embodiment of the present invention in a fully locked position.

As shown in FIG. 2, the plunger 60 has a second plunger portion 70 which has a taper 72 formed within its lowermost portion. The taper 72 extends toward a lower head 74 which has a chamfered lower surface 76. The chamfered lower surface 76 is provided to ease movement of the lower head 74 into a position past the internal ridges 36 and the captivating protrusions 39, as shown in FIG. 2 and 3.

As the plunger 60 is pushed fully into the fastener body 19, the lower head 74 will pass over the ridges 36 defined on the inner walls of the tabs 32 and will engage the angled inner surfaces 38 of the tabs 32 to cause outward movement of the tabs 32 to rigidly affix the fastener 10 to the chasis 14. An upper surface 82 of the lower head 74 will fit underneath the protrusions 39 to captivate the plunger 60 at its fully extended position within the fastener body 19.

Rotation of the plunger 60 when it is pushed fully into the fastener will cause the first plunger portion 64 to engage the inner surfaces of the tabs 42 and cause their pivotal movement about the hinge portions 44 to affix a circuit board 12 to the fastener 10. The projections 68 eventually rest along the walls 69, as shown in FIG. 7, provided along the inner surface of each tab 42 to terminate rotation of the plunger 60. Thus, there is a positive rotational stop within the second locking element 40 to prevent over-rotation of the plunger 60.

Figure 4:
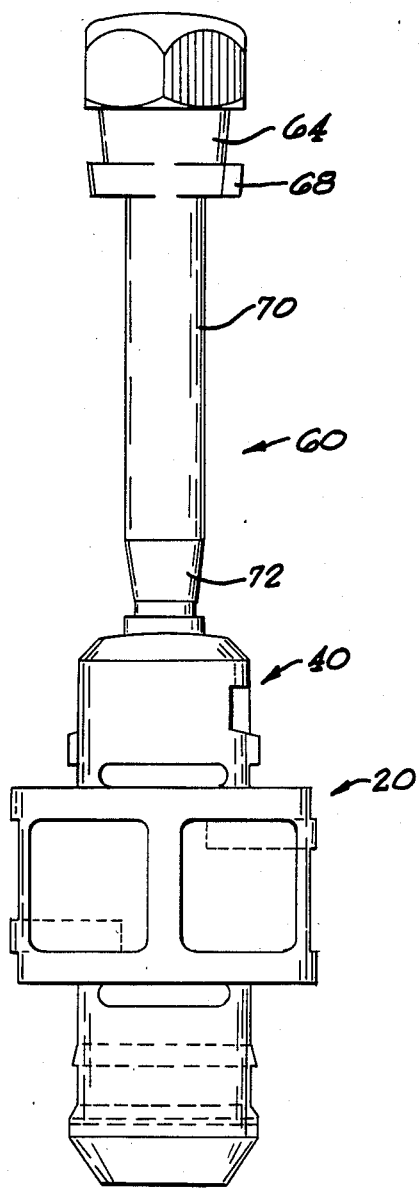
FIG. 4 is a side view illustrating the FIG. 1 embodiment of the present invention in an as molded configuration.

The design of the fastener is such that it may be molded and thereby produced efficiently and economically in large numbers. In FIG. 4, the fastener 10 of the present invention is shown in the molded configuration before a frangible connection 90 between the plunger 60 and the second locking element 40 has been severed. The frangible connection 90 is illustrated in greater detail in FIG. 5, which illustrates the same molded configuration as FIG. 4 except turned 90°. Thus, in the as molded condition the fastener is a one-piece item.

In FIG. 1, the fastener 10 is shown in a shipped condition prior to actuation of the plunger. In this condition the fastener is a one-piece item consisting of two individual preassembled pieces which minimizes inventory, shipping and installation costs. In this configuration, the tabs 32 are normal to the spacer 20, thus the first locking element 30 may be placed into the aperture 18 of the chassis 14. The chamfered lower portions 35 of the tabs 32 permit easy insertion of the first locking element 30 along a vertical axis into the aperture 18. This is important because a straight-in insertion is desirable if the fastener is to be automatically installed by a machine to the chassis or a circuit board.

In FIG. 2, the fastener 10 is shown in the partially locked position, wherein the first locking element 30 is operative to maintain the fastener 10 affixed to the chassis 14. In this configuration the plunger 60 has been fully extended into the channel 22, such that the lower head 74 is disposed below the protrusions 39. As the lower head 74 moves into the position below the protrusions 39, the tabs 32 will pivot outwardly such that they engage the material of the chassis 14 which forms the aperture 18. Thus, the fastener 10 will be immovably fixed and captivated with respect to the chassis 14. As illustrated in FIG. 2, the lower head 74 is captivated by the protrusions 39 to maintain the plunger 60 within the channel 22 and to secure the first locking element 30 within the aperture 18. Such a connection facilitates subsequent mounting or removal of a circuit board which is received by the second locking element of the fastener.

The aperture 16 in the circuit board 12 has a diameter slightly greater than the effective circumference of the second locking element 40, as defined by the outside surfaces of the tabs 42 when in the normal position. In the normal position the circuit board 12 may be moved axially with respect to the plunger 60 and the second locking element 40 to mount or remove the circuit board 12, as shown in FIG. 2. In addition, because the outer diameter defined by the outside surface of tabs 42 when the tabs 42 are not expanded is less than the diameter of the aperture 16 limited lateral or radial movement of the circuit board with respect to the fastener is available for alignment adjustment.

In FIG. 3, the fastener 10 is shown in the fully locked position wherein the circuit board 12 has been mounted to the chassis 14 with the spacer 20 providing a predetermined distance A between the circuit board 12 and the chassis 14. As indicated previously, there may be a plurality of apertures 16 in the circuit board 12 to permit the affixation of the circuit board 12 to the chassis 14 at numerous locations.

When the circuit board 12 contacts the top of the spacer 20, the plunger 60 may be rotated to cause the first plunger portion 64 to engage the inner surfaces of the tabs 42 to cause their outward pivotal movement to engage the material of the circuit board 12 which forms the aperture 16. At this point, the circuit board 12 will be rigidly affixed to the fastener 10 and thus to the chassis 14. The plunger 60 locks over center to provide for added security by providing a positive locking moment.

The pivotal hinged movement and compression of the tabs 32 and the tabs 42 is such that it provides a variable grip range and thereby allows the fastener 10 to function when there is a variation in the aperture size of the circuit board 12 or chassis 14 or when there is a variation in the thickness of the circuit board 12 or chassis 14.

Since the plunger 60 must be fully extended into the fastener body 19 before the second locking element 40 is operative to engage the circuit board 12, the fastener 10 presents a small profile. In addition, it may be advantageous to rotate the plunger 60 into a locked position instead of pushing it into such a position because this avoids applying a pushing force on the circuit board 12 or chassis 14. Also the two step operation is advantageous because when unlocking the fastener 10 it is easier to overcome the frictional resistance which maintains the plunger 60 in the fully locked position.

Figure 5:
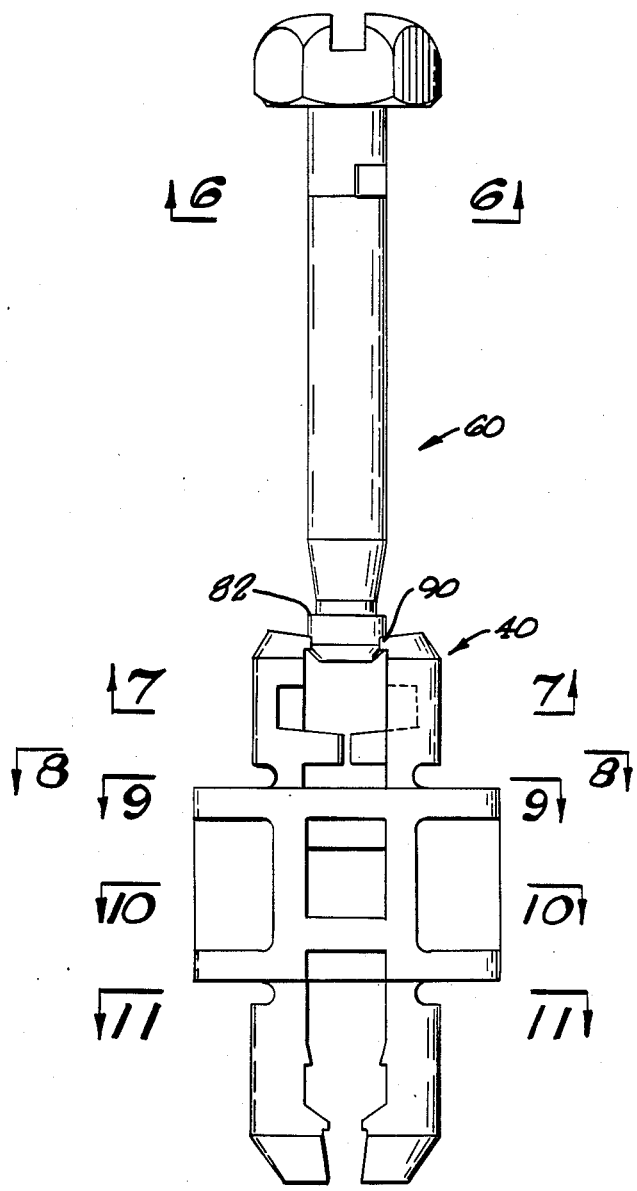
FIG. 5 is a side view turned 90° from FIG. 4 illustrating the FIG. 1 embodiment of the present invention in a molded configuration.

To manufacture the present fastener 10, a mold is made which is capable of producing a single integral unit. The as molded configuration of the present invention is shown in FIGS. 4 and 5. As indicated previously, a frangible connection 90 exists between the bottom of the plunger 60 and the top of the second locking element 40. After the frangible connection 90 has been severed, the plunger 60 may be partially inserted into the channel 22 of the fastener body 19 and remain captivated by the fastener body 19. The fastener is then secured to a chassis or circuit board by an initial actuation or first locking step of the plunger whereby the plunger is pushed in the same direction as the axis of the aperture which receives the first locking element. This first step forever secures the first locking element and thus the fastener to the chassis or circuit board.

A second embodiment of the present invention is shown in FIGS. 12–15, and is generally designated at 110. The configuration of the second embodiment is similar to the preferred embodiment, except for the shape of the inner portion of the first locking element, generally designated as 130, and the shape of the lower portion of the plunger, generally designated as 160.

Briefly, the first locking element 130 has two oppositely positioned tabs 132 which are pivotably attached to the spacer 120 at hinge portions 134. Each of the tabs 132 have chamfered lower surfaces 135 to facilitate easier insertion of the first locking element 130 into the aperture 118 of the chassis or circuit board 114. Along the inner wall of each tab 132 a ridge 136 extends into the channel 122. Each tab 132 has an angled inner cam surface 138 which is provided to ease movement of the plunger 160 into the fully extended position in the first locking element 130 and expand the tabs 132 within the aperture 118.

At the lower end of the plunger 160 dual reduced portions 170, 172 are present which define a first lower head 174 and a second lower head 176. The first lower head 174 has a chamfered lower surface 175 which engages the angled inner cam surfaces 138 of the captivating tabs 132. As the first lower head 174 is pushed between the tabs 132, the tabs 132 will pivot about the hinged portions 134 to rigidly affix the fastener 110 to the chassis 114.

When the plunger 160 is fully extended into the channel 122 the second lower head 176 will be positioned below the ridges 136 such that the upper surface 178 of the second lower head 176 will rest below the ridges 136 to captivate the plunger 160 within the fastener 110.

In FIG. 12, the fastener 110 is shown in the fully locked position wherein the fastener 110 is rigidly affixed to the chassis 114 and the circuit board 112 is rigidly affixed to the fastener 110. The plunger 160 has been rotated to cause the first plunger portion 164 to expand the tabs 142 to affix the circuit board 112 to the fastener 110. As in the preferred embodiment, once the plunger 160 has been fully extended into the fastener 110 the fastener 110 is rigidly affixed to the chassis 114 and the plunger 160 may not be removed because it is captivated in the fastener body 119.

A third embodiment of the present invention is shown in FIGS. 16 and 17, and is generally designated as 210. Briefly, the fastener 210, as shown in FIG. 16, is operative to maintain a plate 212 flush with a body 214. It should be apparent, however, that the fastener 210 of the third embodiment may be constructed to provide for a predetermined distance between the plate 212 and the body 214.

As shown in FIG. 17, the plate 212 is provided with an aperture 216 and the body 214 is provided with a blind hole 218 to which the aperture 216 is aligned.

As shown in FIG. 16, the fastener 210 includes a fastener body, generally designated as 219. A part of the fastener body 219 is a base member or washer, generally designated as 220. Disposed substantially centrally within the fastener body 219 is a channel 222, which extends entirely through the fastener body 219.

Attached to one end of the washer 220 and integral therewith is a first locking element, generally designated as 230, which in the third embodiment consists of two oppositely positioned captivating tabs 232, which are pivotally attached to the washer 220 at the hinge portions 234. These captivating tabs 232 have chamfered portions 235 which are provided to facilitate placement of the first locking element 230 into a blind hole 218 as shown in FIG. 17.

Each captivating tab 232 is provided with a ridge 236 which extends into the channel 222 to captivate a plunger as discussed hereinafter. Each tab 232 is also provided with an angled inner cam surface 238 to facilitate movement of a plunger into the fully extended position between the tabs 232 of the first locking element 230.

Extending outwardly from tabs 232 are a plurality of serrations 239, which are clearly shown in FIGS. 16 and 17, and which are operative to engage the material which forms the blind hole 218. The protruding serrations 239 are designed to resist movement of the fastener 210 out of the blind hole 218 once the plunger has been fully extended into the fastener body 219.

As in the first two embodiments, there are two captivating tabs 232. However, it should be apparent that additional captivating tabs (not shown) of various configurations could be utilized.

Attached to the other end of the washer 220 and integral therewith is a second locking element, generally designated as 240. The second locking element 240 consists of oppositely positioned tabs 242 which are pivotally secured to the washer 220 at hinge portions 244, as shown in FIG. 16. Each of the tabs 242 has a chamfered upper surface 246 and a hollowed inner portion 248. The tabs 242 define an upper portion 249 of the channel 222. Each of the tabs 242 has an aligning piece 250 which extends partially into the upper portion 249 as illustrated in FIG. 16.

A difference between the fastener 110 of the second embodiment and the fastener 210 of the third embodiment is the size of the spacer 120 with respect to the size of the washer 220. The reduced width of the washer 220 compared to the spacer 120 allows for the flush affixation of the plate 212 to the surface of the body 214. In this instance, the washer 220 is placed within a groove or recess 215 in the body 214, as shown in FIG. 17. This permits the plate 212 to be mounted flush to the surface of the body 214. It may be desirable to provide space between the plate 212 and the surface of the body 214 and this may be accomplished by increasing the width of the washer 220.

To use the fastener 210 of the third embodiment, the first locking element 230 is placed into the blind hole 218. The fastener 210 is pushed toward the blind hole 218 such that washer 220 will fit within the groove or recess 215. When this has been accomplished, the plunger 260 is fully extended into the channel 222. Movement of the plunger 260 into the channel 222 will cause the first lower head 274 to engage the angled inner surfaces 238 of the captivating tabs 232. This will cause the tabs 232 to pivot outwardly and engage the surface of the blind hole 218. When the plunger 260 has been fully extended into the channel 222, the captivating tabs 232 will be pivoted outwardly to their maximum distance thus rigidly affixing the fastener 210 to the body 214. The second lower head 276 will rest below the ridges 236 of the tabs 232 and will captivate the plunger 260 in the fastener body 219.

After the fastener 210 has been rigidly affixed to the body 214, the plate 212 may be mounted against the surface of the body 214. The aperture 216 of the plate 212 has a diameter slightly larger than the circumference of the second locking element 240, as defined by the outside surfaces of the tabs 242, when in the unactuated position. When the tabs 242 are in the unactuated position, the plate 212 may be moved axially with respect to the plunger 260 and the second locking element 240 to mount or remove the plate 212.

In FIG. 17, the fastener 210 is shown in the fully locked position. The plate 212 is placed over the plunger 260 and locking element 240 and in contact with the surface of the body 214 and the top of the washer 220. When the plate 212 contacts the top of the washer 220 and the surface of the body 214, the plunger 260 may be rotated to affix the plate 212 to the body 214.

As the plunger 260 is rotated the first plunger portion 264 will engage the inner surfaces of the tabs 242 causing outward pivotal movement of the tabs 242 to rigidly affix the plate 212 to the body 214. In this respect the operation of the third embodiment of the fastener 210 is essentially the same as the operation of the second embodiment of the fastener 110.

When it is desired to remove the plate 212 from the body 214, the plunger is reverse rotated, thus the first plunger portion 264 will move from its engagement with the inner surfaces of the tabs 242 causing the tabs 242 to pivot inwardly to their normal position with respect to the washer 220. When this occurs, the plate 212 may be moved axially with respect to the plunger 260 and locking element 240 to remove the plate 212 from the surface of the body 214.

To manufacture the fastener 210, a mold is made which is capable of producing one complete fastener. The partial molded configuration of the present fastener 210 is shown in FIG. 16. A frangible connection 290 exists between the bottom of the plunger 260 and the top of the second locking element 240. After the frangible connection 290 has been severed, the plunger 260 may be inserted into the channel 222 of the fastener body 219 for the purposes set forth hereinabove.

A fourth embodiment of the present invention is shown in FIGS. 18 through 33, and is generally designated as 310. Briefly, the fastener 310, as shown in FIG. 18, is operative to affix an object such as a circuit board 312 to a chassis 314 wherein a predetermined distance A is intended to exist between the board 312 and the chassis 314.

Circuit boards 312 of the type used are referred to previously and these circuit boards 312 may have a plurality of spaced apertures 316 extending entirely through the body of the circuit boards 312. Similarly, the chassis 314 is of the type referred to previously and these chassis 314 may have a plurality of spaced apertures 318 defined therein. The apertures 316 and apertures 318 are uniformly spaced to permit their alignment when the circuit board 312 is to be mounted to the chassis 314.

Figure 18:
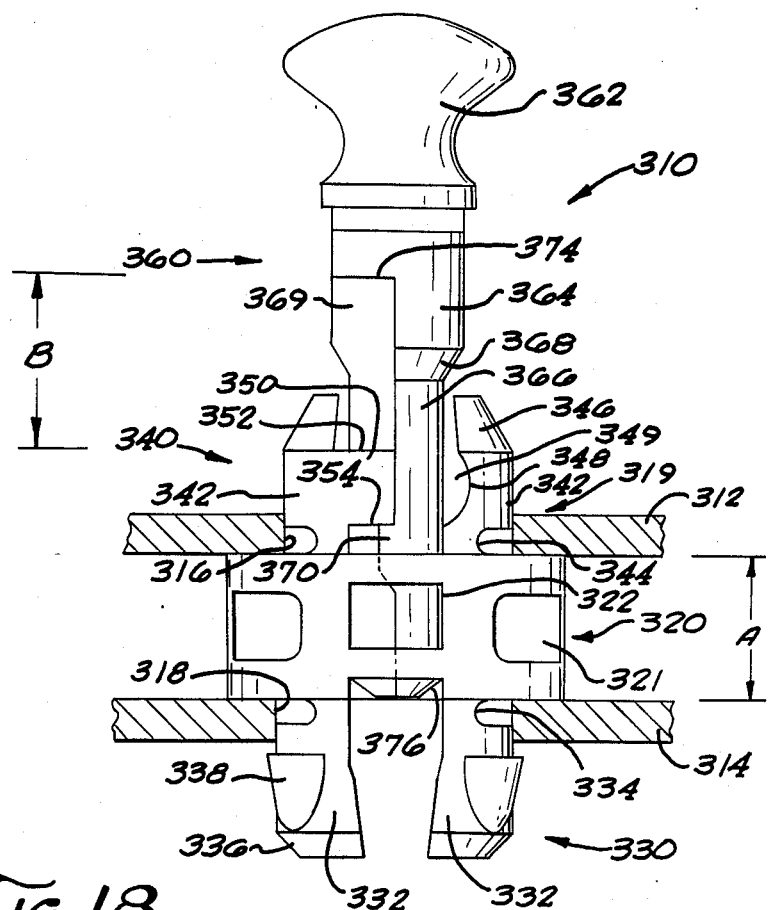
FIG. 18 is a side view illustrating still another embodiment of the present invention in an unlocked position.
Figure 29:
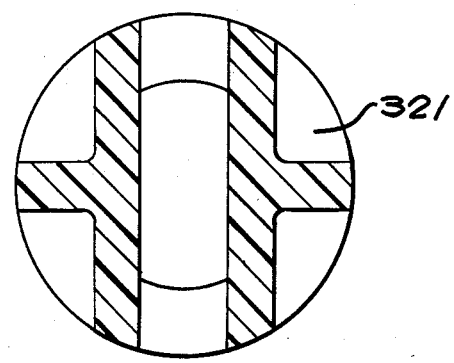
FIG. 29 is a cross-section taken substantially along section line 29—29 of FIG. 20.

As shown in FIG. 18, the fastener 310 includes a fastener body, generally designated as 319. A part of the fastener body 319 is a base member or spacer, generally designated as 320, which is preferably made of an nonconductive material, such as plastic. For purposes of weight reduction and material use reduction, the spacer 320 may have a plurality of voids 321 located therein, as best shown in FIGS. 18 and 29. Disposed substantially centrally within the fastener body 319 is a channel 322, which extends entirely through the fastener body 319.

Figure 19:
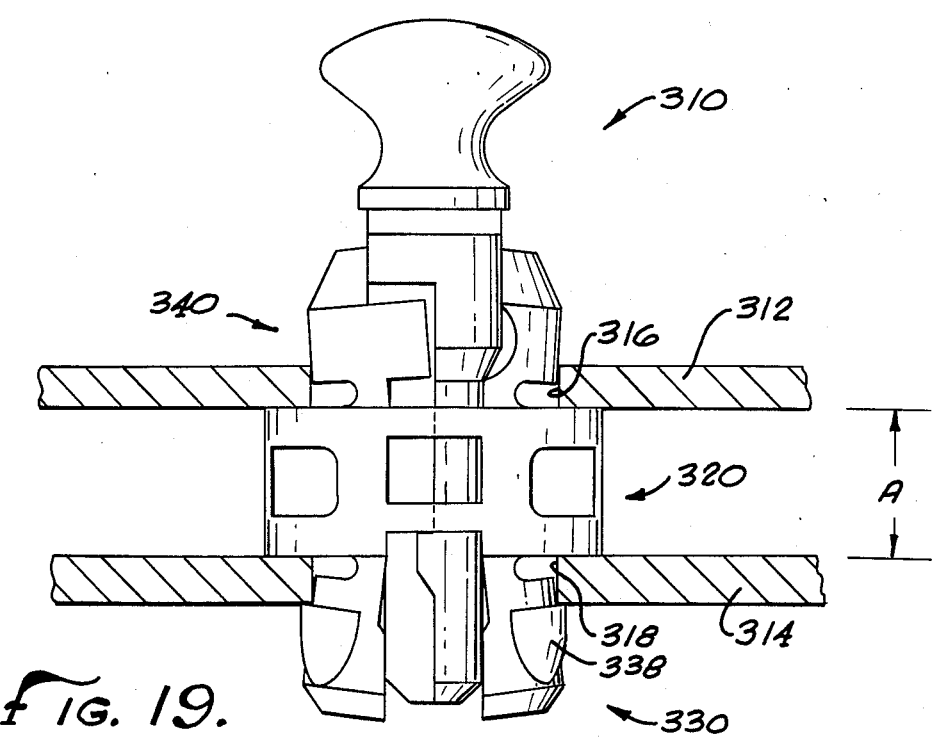
FIG. 19 is a side view illustrating the FIG. 18 embodiment of the present invention in a fully locked position.

Attached to one end of the spacer 320 and integral therewith is a first locking element, generally designated as 330, which in this embodiment consists of two oppositely positioned captivating tabs 332, which are pivotably attached to the spacer 320 at the hinge portions 334. These captivating tabs 332 have chamfered portions 336 which are provided to facilitate placement of the first locking element 330 into and through the aperture 318. Extending outwardly from the tabs 332 are a plurality of raised portions 338, which are also shown in FIGS. 19, 20, 21, 30, 31 and 32. The raised portions 338 are positioned along the tabs 332 to permit a portion of the chassis 314 to fit between the top of the raised portions 338 and the bottom of the spacer 320, as shown in FIG. 19.

In the unlocked position as shown in FIG. 18, the fastener 310 is capable of rotational movement with respect to the chassis 314. However, once the first locking element 330 has been placed into and through the aperture 318, the raised portions 338 are operative to maintain the chassis 314 in contact with the spacer 320 to captivate the fastener 310.

Figure 27:
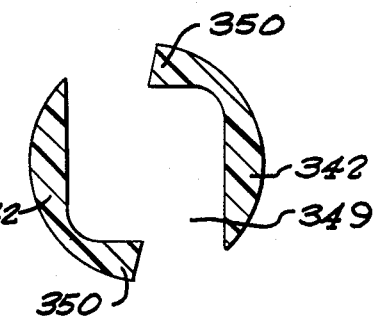
FIG. 27 is a cross-section taken substantially along section line 27—27 of FIG. 20.
Figure 28:
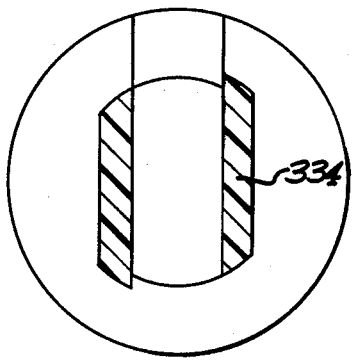
FIG. 28 is a cross-section taken substantially along section line 28—28 of FIG. 20.

Attached to the other end of the spacer 320 and integral therewith is a second locking element, generally designated as 340. The second locking element 340 consists of oppositely positioned tabs 342 which are pivotably secured to the spacer 320 at hinge portions 344. Each of the tabs 342 has a chamfered upper surface 346 and a semi-circular recess 348, which adds flexibility to the tabs 342. The tabs 342 define an upper portion 349 of the channel 322. Each of the tabs 342 has an aligning piece 350 which extends partially into the upper portion 349 as illustrated in FIGS. 18 and 27.

The aligning pieces 350 each have an upper surface 352 which may also act as a stop for the plunger when it is pushed downward into the channel 322 as discussed hereinafter. The lower surface 354 of each of the tabs 350 is operative to captivate the plunger within the channel 322 and thus define the maximum outward movement of the plunger.

Figure 22:
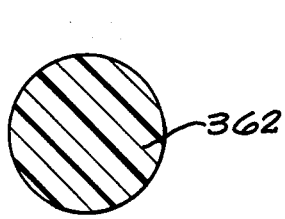
FIG. 22 is a cross-section taken substantially along section line 22—22 of FIG. 20.
Figure 23:
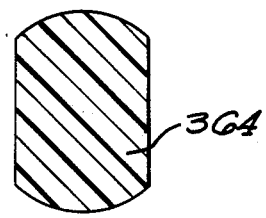
FIG. 23 is a cross-section taken substantially along section line 23—23 of FIG. 20.
Figure 25:
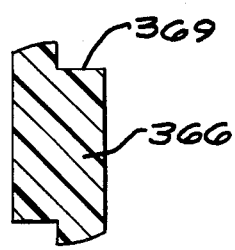
FIG. 25 is a cross-section taken substantially along section line 25—25 of FIG. 20.
Figure 26:
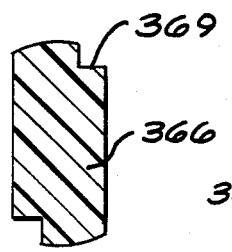
FIG. 26 is a cross-section taken substantially along section line 26—26 of FIG. 20.

A plunger, generally designated as 360, is designed to fit into the channel 322. The plunger 360 has a head portion 362 which is integral with a downwardly extending first rod portion 364. The cross-section of the head portion 360 is shown in FIG. 22 and the cross-section of the first rod portion is shown in FIG. 23. The first rod portion 364 is adapted to extend downardly into the second locking element 340 and is integral with a second rod portion 366 which is of less width. A cross-section of the second rod portion is shown in FIG. 25. Because of the difference in widths between the first rod portion 364 and the second rod portion 366 a cam shoulder 368 is formed.

Figure 24:
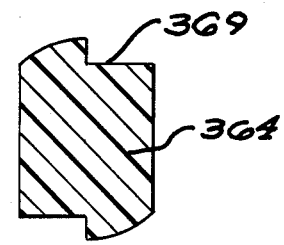
FIG. 24 is a cross-section taken substantially along section line 24—24 of FIG. 20.

Defined within each side of the plunger 360 is a guide recess 369, reference to which is made in FIGS. 18 and 24. The guide recesses 369 extend through part of the first rod portion 364 and entirely through the second rod portion 366 as shown in FIG. 18, 24, 25 and 26. The guide recesses 369 are adapted to receive the aligning pieces 350 to maintain the plunger 360 in proper position when moved axially within the channel 322.

A stop 370 is integral with the second rod portion 366, and is placed within each of the guide recesses 369. Each stop 370 has an upper surface 372 as shown in FIG. 20, which will contact the lower surface 354 of an associated aligning piece 350 to captivate the plunger 360 within the fastener body 319 and resist further retraction of the plunger 360.

As shown in FIG. 18, an upper surface 374 of the guide recess 369 and the upper surface 352 define a distance B which is the maximum travel of the plunger 360, when captivated within the fastener body 319. The lower edge 376 of the second rod portion 366 is chamfered to ease movement of the plunger 360 into the first locking element 330.

Figure 20:
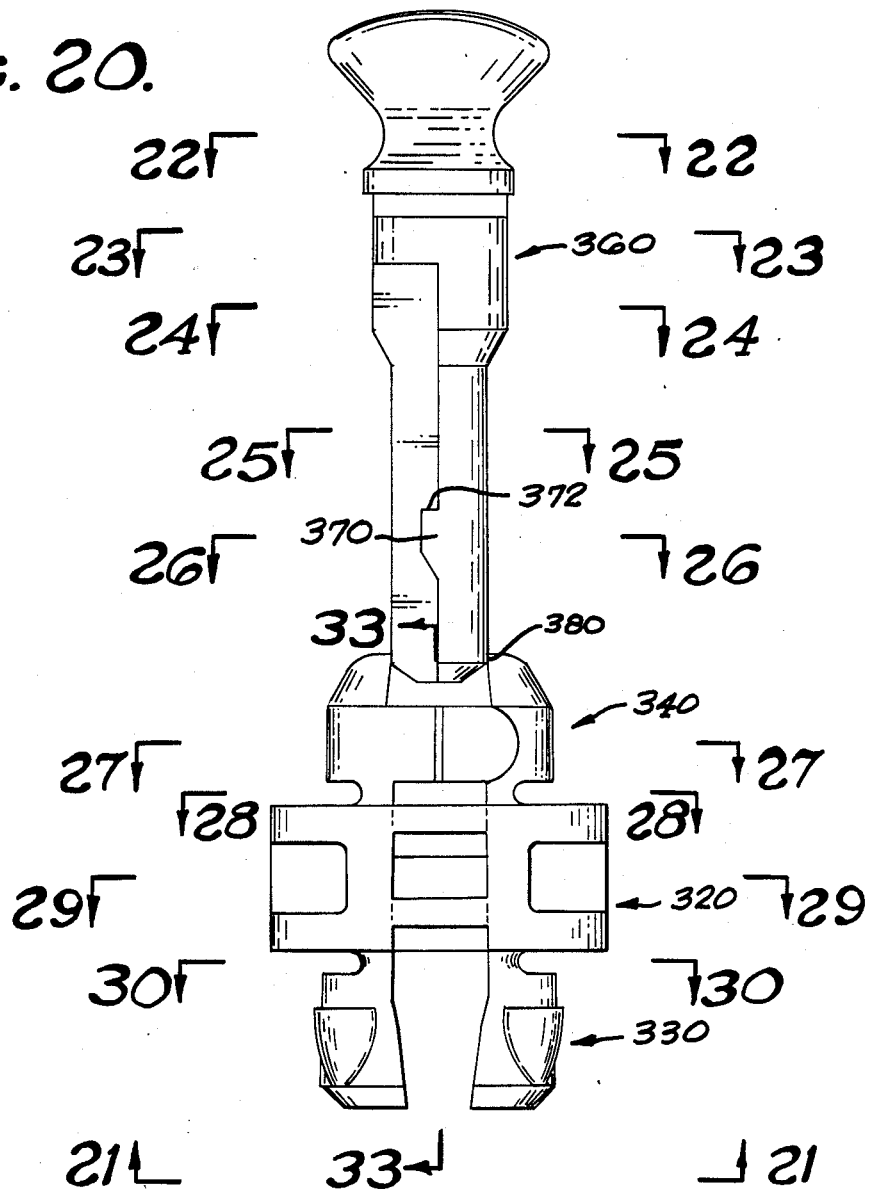
FIG. 20 is a side view illustrating the FIG. 18 embodiment of the present invention in an as molded configuration.
Figure 21:
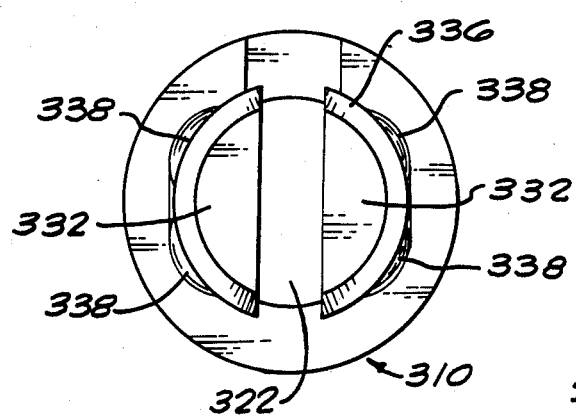
FIG. 21 is a bottom view taken substantially along view line 21—21 of FIG. 20.

In FIG. 20 the fastener 310 of the present invention is shown in the as molded configuration before the frangible connection between the plunger 360 and the second locking element 340 has been severed. The frangible connection 380 is illustrated in greater detail in FIG. 33.

In FIG. 18 the fastener 310 is shown in the unlocked configuration. In this position the tabs 332 of the first locking element 330 have been pushed through the aperture 318 into the chassis 314. Thus, the fastener 310 is captivated with respect to the chassis 314. When the fastener 310 is in the unlocked configuration, the first rod portion 364 is disposed outside of the second locking element 340, thus, the unbiased tabs 342 of the second locking element 340 are positioned normal to the circuit board 312. The aperture 316 in the circuit board 312 has a diameter slightly greater than the effective circumference of the second locking element 340, as defined by the outside surfaces of the tabs 342, when the unlocked position. In the unlocked position the circuit board 312 may be moved axially with respect to the plunger 360 and the second locking element 340 to mount or remove the circuit board 312.

In FIG. 19, the fastener 310 is shown in the locked position. The circuit board 312 is placed over the plunger 360 and in contact with the spacer 320. As indicated previously, there may be a plurality of apertures 316 in the circuit board 312 to permit the affixation of the circuit board 312 at numerous locations. When the circuit board 312 contacts the top of the spacer 320, the plunger 360 may be pushed into the channel 322 of the fastener body 319 to affix the circuit board 312 to the chassis 314.

As the plunger 360 moves into the channel 322, cam shoulder 368 will contact the upper portion of each tab 342 of the second locking element 340, and the first rod portion 364 will cause outward movement of the tabs 342 until the tabs 342 contact the portion of the circuit board 312 which forms the aperture 316. When the first rod portion 364 has been pushed a certain distance into the channel 322, the cam shoulder 368 will contact the lowermost portion of the second locking element 340 to terminate downward movement of the plunger 360. At this point the circuit board 312 will be rigidly affixed to the fastener 310 and the chassis 314.

Simultaneous with the movement of the tabs 342 outward, the second rod portion 366 will cause the normally positioned tabs 332 to move outwardly. In turn, this will cause the raised portions 338 to move outwardly and affix the chassis 314 between the spacer 320 and the upper surface of the raised portions 338, as shown in FIG. 19.

As the plunger 360 is retracted to unlock the circuit board 312 from the chassis 314, the first locking element 330 will loosen its grip on the chassis 314 to permit limited radial movement or float of the fastener 310. The second locking element 340 will also loosen its grip on the circuit board 312 to permit the circuit board 312 to be removed over the plunger 360 and second locking element 340. As the plunger 360 is retracted to unlock the circuit board 312 from the chassis 314, the upper surface of the stop 370 will contact the lower surface 354 of the aligning piece 350 to resist further retraction of the plunger 360. Thus, the plunger 360 may not be totally retracted from the fastener body 319. The placement of the stop 370 thus defines the maximum position that the plunger 360 may be retracted from the fastener body 319 in the unlocked position.

To manufacture the present fastener 310, a mold is made which is capable of producing one complete fastener. The molded configuration of the present invention is shown in FIG. 20. A frangible connection 380 exists between the bottom of the plunger 360 and the top of the second locking element 340. After the frangible connection has been severed, the plunger 360 may be inserted into the channel 322 of the fastener body 319 for the purposes set forth hereinabove.

A final embodiment of the present invention is shown in FIGS. 34-36. In FIG. 34 a side perspective view of the fastener of the present invention is shown. Briefly, the fastener, generally designated 410, is operative to affix an object such as a circuit board 412 to a chassis 414 or another circuit board wherein a predetermined distance A is intended to exist between the board 412 and the chassis 414. The distance A is dependent upon the type of electrical circuit boards 412 that may be used. The circuit board includes an aperture 416. The chassis 414 includes an aperture 418.

The fastener 410 includes a fastener body, generally designated 419. An integral part of the fastener body 419 is a base member or spacer, generally designated 420, which is preferably made of a non-conductive material. For purposes of weight reduction the spacer 420 may have a plurality of voids 421 located therein. The fastener body 419 has an internal channel 422 substantially in the center, which runs entirely through the fastener body 419. A ridge 424 extends into the channel 422 from each side thereof.

Attached to one end of the spacer 420 and integral therewith is a first locking element, generally designated 430, which in the first embodiment consists of two oppositely positioned captivating tabs 432 which are pivotally attached to the spacer 420 at the recessed portions 434. These captivating tabs 432 have wall sections 436 which are integral with angled ribs 438 attached to the wall sections 436. The ribs 438 extend toward the spacer 420 and are capable of limited pivotal movement with respect to the wall sections 436. The ribs 438 are connected to the wall sections 436 such that pivotal movement away from the wall sections is resisted.

A protrusion 439 extends outwardly from each wall section 436 and is adapted to fit within the aperture 418 of the chassis 414. The size of the protrusions 439 will determine the range of movement or radial float of the first locking element 430 with respect to the chassis 414.

Attached to the other end of the spacer 420 and integral therewith is a second locking element, generally designated 440. The element 440 consists of oppositely positioned tabs 442 which are pivotally secured to the spacer 420 at pivots 444. The tabs 442 define an upper portion 446 of the channel 422 which has at its centermost portion a hollowed area 448 extending into each of the tabs 442. The hollowed area 448 provides for flexibility of the tabs 442 and may receive a detent (not shown) on the plunger to further secure the plunger in the locked position. Disposed into the upper portion 446 of the channel 422 from each of the tabs 442 is an aligning piece 450.

On each side of the second rod portion 466 is a recess 470. The recesses 470 are adapted to receive the ridges 424 which guide the plunger 460 and captivate it with respect to the fastener body 419. At the lower end of each recess 470 is a surface 472 which engages the lower surface 478 of the ridge 424 when the plunger 460 is retracted. At the lower end of the plunger 460 are chamfered surfaces 476 which facilitate downward movement of the plunger into the fastener body 419.

In FIG. 35 the fastener 410 is shown in the unlocked configuration. In this position, the tabs 432 of the first locking element 430 are biased inwardly and, thus, the angled ribs 438 do not contact the lower surface of the chassis 414.

When the fastener 410 is in the unlocked position, the first rod portion 464 is disposed outside of the second locking element 440, thus, the unbiased tabs 442 of the second locking element 440 are positioned normal to the plane of the circuit board 412. The aperture 416 in the board 412 has a diameter greater than the effective circumference of the second locking element 440, as defined by the outside surface of the tabs 442, when in the unlocked position. Thus, the board 412 may be moved axially with respect to the plunger 460 and the second locking element 440 to either mount or remove the board 412.

As the plunger 460 is retracted to unlock the board 412 from the chassis 414, the surfaces 472 of the recesses 470 come in contact with the inwardly extending bottom surfaces 478 of the ridges 424. Thus, the plunger 460 may not be totally retracted from the fastener body 419. The ridges 424 thus define the maximum position that the plunger 460 may be retracted in the unlocked position.

Briefly, in FIG. 36, the position of the angled ribs 438 is shown with respect to the lower surface of the chassis 414 when the circuit board 412 is locked to the fastener 410. The ribs 438 are permitted limited pivotable movement toward the wall section 436 to permit the first locking element 430 to be inserted into the aperture 18 of the chassis 14.

To manufacture the fastener 410 of the present invention a mold is made which is capable of producing one complete fastener. In the molded state, the plunger 460 is integral with the uppermost portion of the second locking element 440, whereby a frangible connection exists. After the frangible connection has been severed, the plunger 460 may be inserted into the channel 422 of the fastener body 419.

To use the fastener 410 of the present invention, first locking element 430 of the molded fastener 410 is inserted into and through the aperture 418. When the plunger 460 is in the retracted position, as shown in FIG. 35, the circuit board 412 may be mounted by passing the plunger 460 and second locking element 440 through the aperture 416. As indicated previously, there may be a plurality of apertures 416 in the circuit board to permit the affixation of the board 412 at numerous locations. When the board 412 contacts the top of the spacer 420, the plunger 460 may be pushed into the channel 422 of the fastener body 419 for the purposes stated herein.

As the plunger 460 moves into the channel 422, the first rod portion 464 will cause outward movement of the tabs 424 until the tabs 424 contact the portion of the board 412 which forms the aperture 416. At this point, the board 412 will be rigidly affixed to the fastener 410. Simultaneous with the movement of the tabs 424 outward, the second rod portion 466 will cause the tabs 432 to move outwardly. In turn, this will cause the ends of the ribs 438 to engage the bottom surface of the chassis 414 thus clamping the fastener 410 to the chassis 414.

Although the present invention has been described in great detail herein, it should be apparent to those of ordinary skill in the art that various modifications could be made to the fasteners 10, 110, 210, 310, 410 to perform in a similar manner, without departing from the spirit and scope of the following claims.

What is claimed is:

1. A fastener for joining a first structure at a first aperture therein in a fixed relationship to a second structure at a second aperture therethrough, comprising
    a fastener body including a first locking element, a second locking element and a channel extending through said first locking element and said second locking element, said first locking element having first movable tabs and said second locking element having second movable tabs; and
    a plunger slidably extending into said channel, said plunger and said channel including first camming surfaces constructed and arranged for moving said first tabs outwardly with axial advancement of said plunger relative to said fastener body and second camming surfaces constructed and arranged for moving said second tabs outwardly with rotation of said plunger relative to said fastener body with said plunger advanced in said channel and means on said plunger for moving said plunger both axially and rotatably.

2. The fastener of claim 1 wherein said means for moving said plunger include a head at one end of said plunger.

3. The fastener of claim 2 wherein said head is noncircular in plan.

4. The fastener of claim 3 wherein said head is hexagonal in plan.

5. The fastener of claim 4 wherein said head has a cavity which is noncircular in plan at one end of said plunger.

6. The fastener of claim 1 wherein said means include a cavity which is noncircular in plan at one end of said plunger.

7. The fastener of claim 6 wherein said cavity is a slot.

8. A fastener for joining a first structure at a first aperture thereon in a fixed relationship to a second structure at a second aperature theretrough, comprising
    a fastener body including a first locking element, a second locking element and a channel extending through said first locking element and said second locking element, said first locking element having first movable tabs which form a first split body portion of said fastener body and said second locking element having second movable tabs which form a second split body portion of said fastener body, said fastener body further including a spacer between said first locking element and said second locking element; and
    a plunger slidably extending into said channel, said plunger and said channel including first camming surfaces constructed and arranged for moving said first tabs outwardly with axial advancement of said plunger relative to said fastener body and second camming surfaces constructed and arranged for moving said second tabs outwardly with rotation of said plunger relative to said fastener body with said plunger advanced in said channel and means on said plunger for moving said plunger both axially and rotatably.

9. The fastener of claim 8 wherein said split body portions are of substantially circular cross section.

10. The fastener of claim 8 wherein said spacer is of greater cross-sectional dimension than said first and second split body portions.

11. The fastener of claim 8 wherein said plunger extends from said second locking element to define said means for moving said plunger which is no larger than said split body portion in cross section.

12. A fastener for joining a first structure at a first aperture therein in a fixed relationship to a second structure at a second aperture therethrough, comprising
    a fastener body including a first locking element, a second locking element and a channel extending through said first locking element and said second locking element, said first locking element having first movable tabs and second locking elements having second movable tabs; and
    a plunger slidably extending into said channel said plunger and said channel including first camming surfaces constructed and arranged for moving said first tabs outwardly with axial advancement of said plunger relative to said fastener body and said plunger having projections extending laterally therefrom to engage and move outwardly said second tabs with angular rotation of said plunger relative to said fastener body, said channel including recesses for receipt of said projections and means on said plunger for moving said plunger both axially and rotatably.

13. The fastener of claim 12 wherein said plunger is angularly uniform at said first locking element so as to move said tabs outwardly with advancement of said plunger without regard to the angular orientation of said plunger in said body.

14. The fastener of claim 12 wherein said projections are two in number and extend laterally from said plunger on opposite sides thereof.

15. A fastener for joining a first structure at a first aperture therein in a fixed relationship to a second structure at a second aperture therethrough comprising a fastener body including a first locking element, a second locking element and a channel extending through said first locking element and said second locking element, said first locking element having first movable tabs and said second locking element having second movable tabs; and a plunger slidably extending into said channel, said plunger including a first head of circular cross section at one end of said plunger and projections extending laterally from said plunger at a location displaced from said first head, said channel including inner cam surfaces at said first locking element to engage said first head for moving said first tabs outwardly with axial advancement of said plunger in said channel, said channel having recesses at said second locking element for receipt of said projections, said recesses including camming surfaces for moving said second tabs outwardly with rotation of said plunger and said projections thereon relative to said channel with said plunger advanced in said fastener body and means on said plunger for moving said plunger both axially and rotatably.

* * * * *